United States Patent [19]

Yamashita et al.

[11] Patent Number: 5,394,048
[45] Date of Patent: Feb. 28, 1995

[54] HIGH-VOLTAGE GENERATOR

[75] Inventors: Tetsuji Yamashita; Hitoshi Kawabata, both of Kanagawa, Japan

[73] Assignee: Kabushiki Kaisha Toshiba, Kawasaki, Japan

[21] Appl. No.: 95,911

[22] Filed: Jul. 23, 1993

[30] Foreign Application Priority Data

Jul. 27, 1992 [JP] Japan ............................ 4-199833

[51] Int. Cl.6 ........................................ H01L 41/08
[52] U.S. Cl. ................................... 310/316; 310/318
[58] Field of Search ............... 310/316, 318, 319, 359, 310/366

[56] References Cited

U.S. PATENT DOCUMENTS

| 3,690,309 | 9/1972 | Pluzhnikov et al. | 310/318 |
| 3,796,897 | 3/1974 | Sakurai | 310/318 |
| 4,044,317 | 8/1977 | Newell et al. | 310/366 |
| 4,054,936 | 10/1977 | Ansai et al. | 310/318 |
| 4,303,908 | 12/1981 | Enemark et al. | 340/384 E |
| 4,376,919 | 3/1983 | Konno et al. | 310/366 |
| 5,050,085 | 9/1991 | Wright | 310/318 |

FOREIGN PATENT DOCUMENTS

| 2047882 | 4/1971 | Germany | 310/318 |
| 0584291 | 12/1977 | U.S.S.R. | 310/318 |

Primary Examiner—Thomas M. Dougherty
Attorney, Agent, or Firm—Foley & Lardner

[57] ABSTRACT

A high-voltage generator employing a piezoelectric transformer has an inverter having input and output terminals connected to input terminals of the piezoelectric transformer, respectively; a feedback resistor connected to the input terminals of the piezoelectric transformer in parallel with the inverter; and first and second capacitors. The first capacitor is connected between the input terminal of the inverter and a ground. The second capacitor is connected between the output terminal of the inverter and the ground. The inverter, feedback resistor, and capacitors form a self-exciting oscillator to drive the piezoelectric transformer so that the piezoelectric transformer produces a high-voltage output. Since the inverter, feedback resistor, and capacitors are small, thin and light, the high-voltage generator as a whole is also small, thin and light.

5 Claims, 6 Drawing Sheets

INPUT TERMINALS

OUTPUT TERMINAL

POWER SOURCE

PHASE DETECTOR

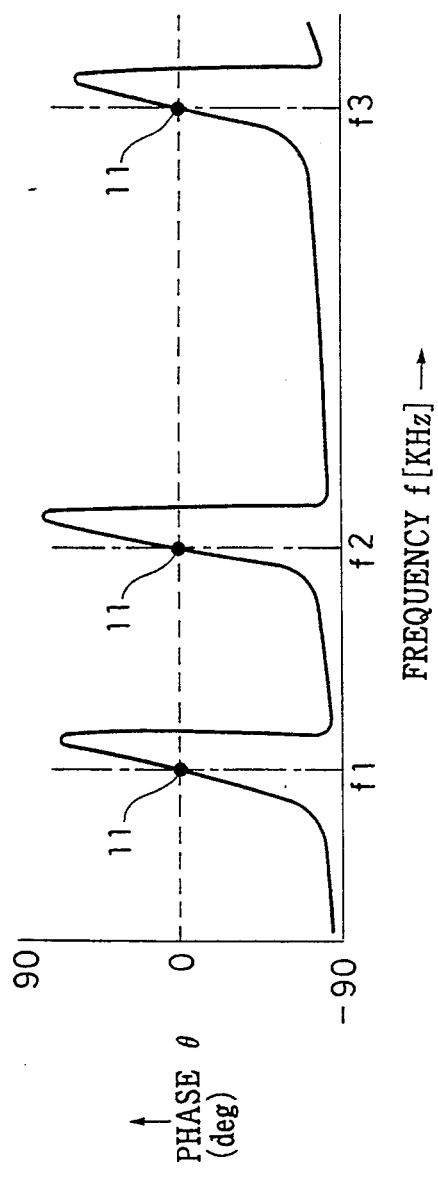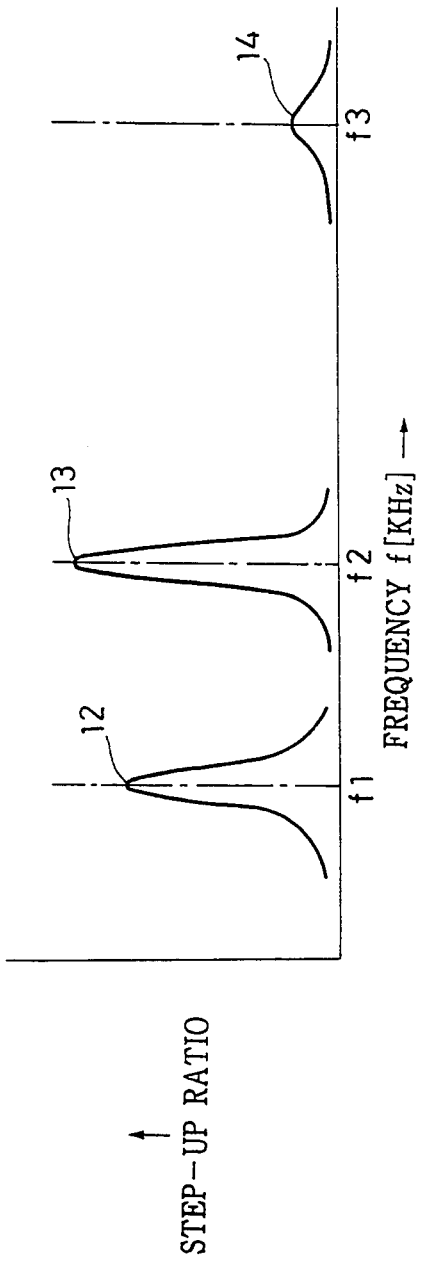

HIGH-VOLTAGE GENERATOR

BACKGROUND OF THE INVENTION

1. Field of the Invention

The present invention relates to a high-voltage generator employing a piezoelectric transformer, and particularly, to a high-voltage generator that fully utilizes the advantage of the piezoelectric transformer that it is small, thin and light, to reduce the size, thickness and weight of the high-voltage generator.

2. Description of the Prior Art

A piezoelectric transformer causes electrostriction effect and piezoelectric effect to produce a high voltage in response to an input voltage that meets the resonance frequency of the transformer.

FIG. 1 schematically shows such a piezoelectric transformer. This transformer is made of a thin ceramic plate 27. Half of each face 28 of the ceramic plate 27 is coated with an electrode 30, and an end face of the ceramic plate 27 is coated with an electrode 31. This piezoelectric transformer is small, thin, and light.

FIG. 2 shows a conventional high-voltage generator employing the piezoelectric transformer of FIG. 1. The generator includes a self-exciting oscillator that oscillates in synchronism with the resonance frequency of the piezoelectric transformer, to drive the transformer.

In FIG. 2, the high-voltage generator has the piezoelectric transformer 21, a winding transformer 22, a phase detector 23, an amplifier 24 formed of a transistor, and a load resistor 25. The winding transformer 22, phase detector 23, and amplifier 24 form the self-exciting oscillator. The piezoelectric transformer 21 is inserted in a feedback loop of the oscillator. The winding transformer 22 and phase detector 23 detect the phases of input voltage and current to the transformer 21.

The oscillator always oscillates at a resonance frequency at which the phase difference of the input voltage and current to the piezoelectric transformer 21 becomes zero. Namely, the oscillator oscillates to drive the piezoelectric transformer 21 at a frequency at which internal resistance is minimized and a feedback quantity is maximized. An output terminal of the piezoelectric transformer 21 provides an alternating-current (AC) high voltage to the load resistor 25.

FIG. 3 shows a concrete example of the conventional high-voltage generator of FIG. 2. A piezoelectric transformer 21 is inserted in a feedback loop and is driven with zero phase difference. An output of the piezoelectric transformer 21 is rectified by a rectifier 26 to supply a direct-current (DC) high voltage to a load.

In the conventional high-voltage generator, the winding transformer for detecting a phase in the self-exciting oscillator occupies a large space, to increase the overall size of the high-voltage generator. This results in deteriorating the advantage of the piezoelectric transformer that it is small, thin, and light.

SUMMARY OF THE INVENTION

To solve the problem, an object of the present invention is to provide a high-voltage generator of simple, small, thin and light structure.

In order to accomplish the object, the present invention provides a high-voltage generator having an inverter, a piezoelectric transformer having two input terminals connected between input and output terminals of the inverter, a feedback resistor connected between the input and output terminals of the inverter in parallel with the piezoelectric transformer, a capacitor connected between the input terminal and a ground, and another capacitor connected between the output terminal of the inverter and the ground. An output terminal of the piezoelectric transformer provides a high voltage.

In this arrangement, the inverter, feedback resistor, and capacitors cause self-exciting oscillation at a resonance frequency that is the same as the natural oscillation frequency of the piezoelectric transformer. This oscillation drives the piezoelectric transformer, which then provides an AC high voltage from an output terminal thereof. Since the inverter, feedback resistor, and capacitors are small, thin and light, the high-voltage generator as a whole is also small, thin and light with full use of the advantage of the piezoelectric transformer.

These and other objects, features and advantages of the present invention will be more apparent from the following detailed description of preferred embodiments in conjunction with the accompanying drawings.

BRIEF DESCRIPTION OF THE DRAWINGS

FIGS. 9(a) and 9(b) are graphs showing the frequency characteristics of a piezoelectric transformer.

DETAILED DESCRIPTION OF THE EMBODIMENTS

Figure 1:
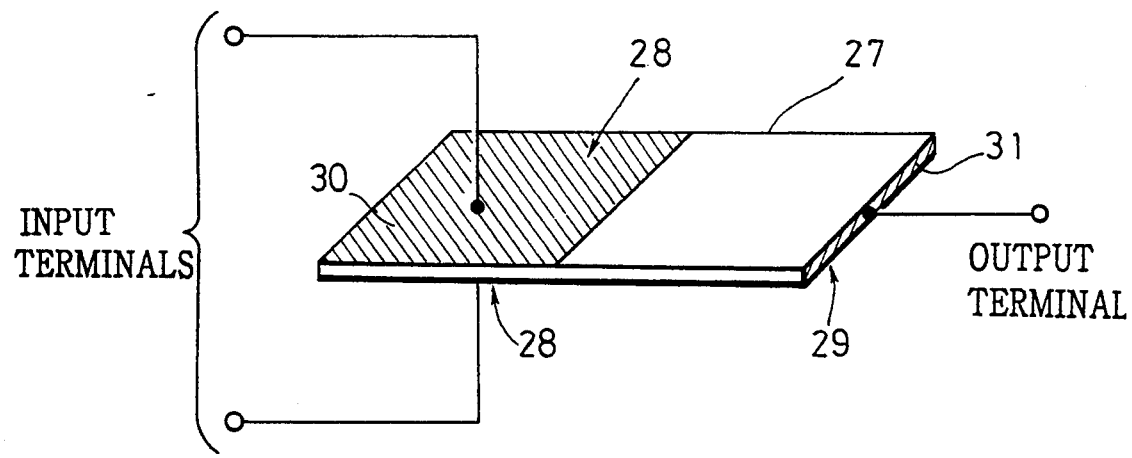
FIG. 1 is a schematic view showing a standard piezoelectric transformer.
Figure 2:
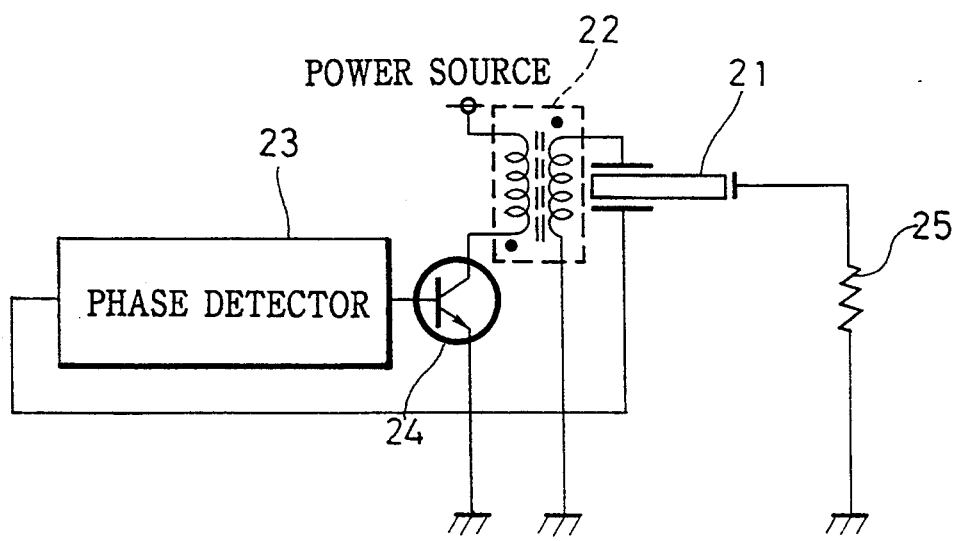
FIG. 2 is a circuit diagram showing the principle of a high-voltage generator according to a prior art.
Figure 3:
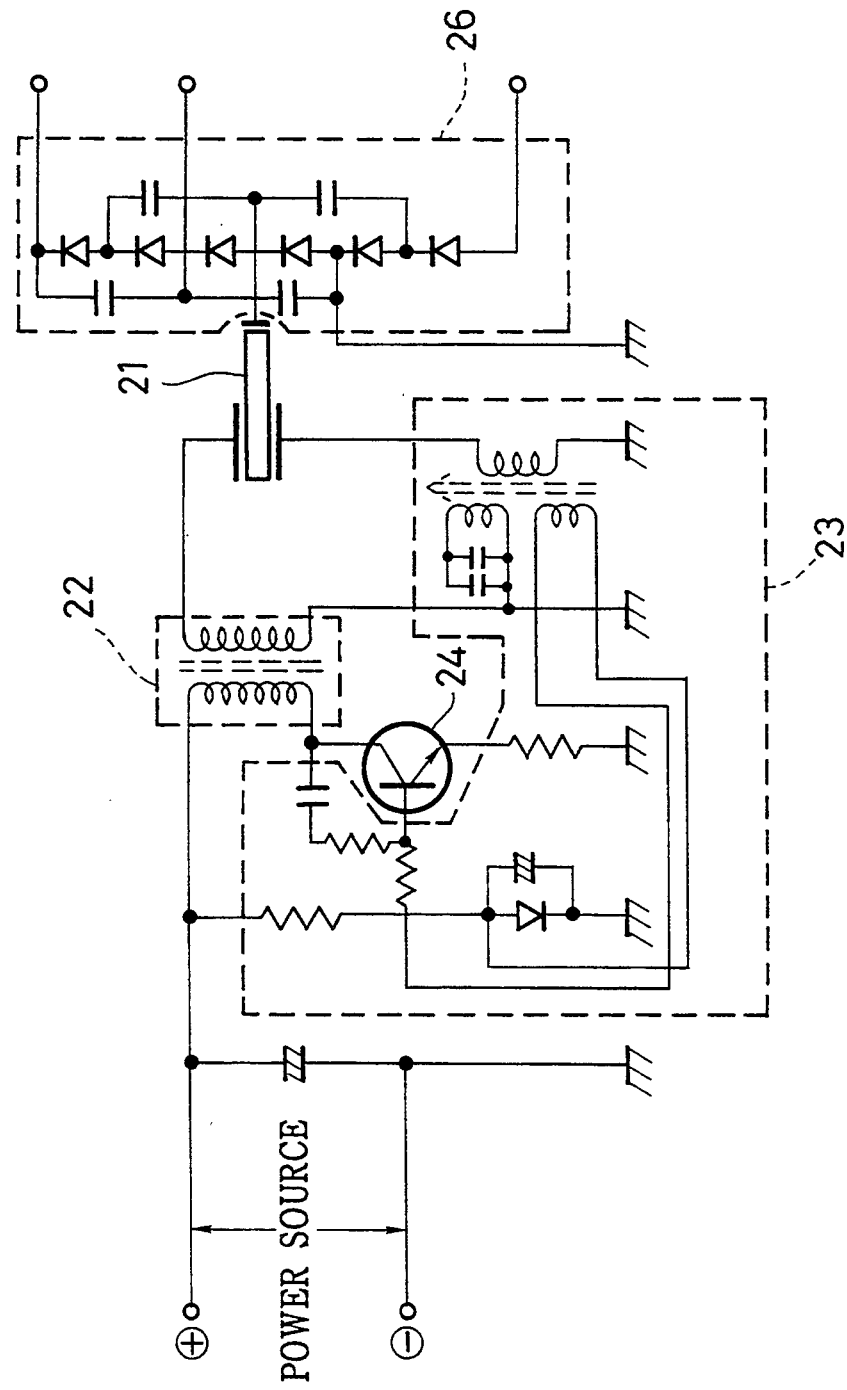
FIG. 3 is a circuit diagram showing an example of a high-voltage generator according to the principle of the prior art of FIG. 2.
Figure 4:
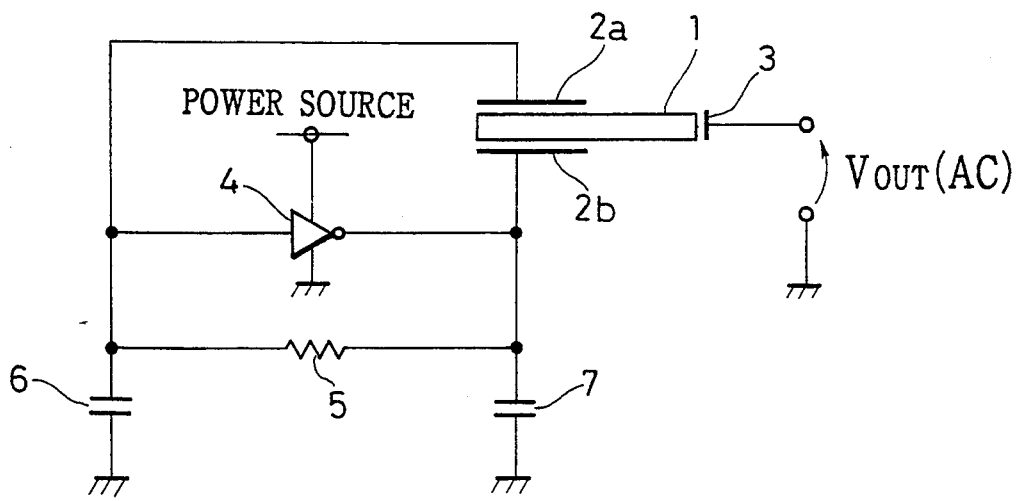
FIG. 4 is a circuit diagram showing a high-voltage generator according to a first embodiment of the present invention.

FIG. 4 shows a high-voltage generator according to the first embodiment of the present invention.

This high-voltage generator is small, thin, and light, and employs a general-purpose CMOS IC inverter 4. A piezoelectric transformer 1 has input terminals 2a and 2b that are connected to input and output terminals of the inverter 4, respectively. A feedback resistor 5 is also connected to the input and output terminals of the inverter 4 in parallel with the piezoelectric transformer 1. A capacitor 6 is connected between the input terminal of the inverter 4 and a ground, and another capacitor 7 is connected between the output terminal of the inverter 4 and the ground.

The inverter 4, feedback resistor 5, and capacitors 6 and 7 form a self-exciting oscillator whose resonance frequency is the same as the natural oscillation frequency of the piezoelectric transformer 1.

In FIG. 4, a left half of the piezoelectric transformer 1 is a drive section, and a right half thereof is a generation section. The input terminals 2a and 2b are arranged on opposite faces of the drive section, respectively, and an output terminal 3 is arranged on an end face of the generation section.

The feedback resistor 5 biases the inverter 4. Generally, the feedback resistor 5 has high resistance in order to prevent alternating-current effect.

When receiving oscillation signals from the self-exciting oscillator through the input terminals 2a and 2b, the piezoelectric transformer 1 longitudinally oscillates due to electrostriction effect, to produce an AC high voltage Vout(AC) from the output terminal 3.

Figure 5A:
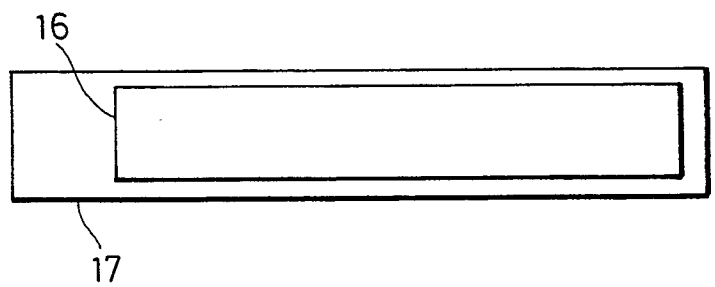
FIGS. 5(a) to 5(c) are schematic views showing an assembled state of the high-voltage generator of FIG. 4.
Figure 5B:
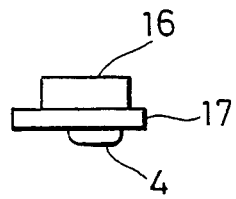
Figure 5C:
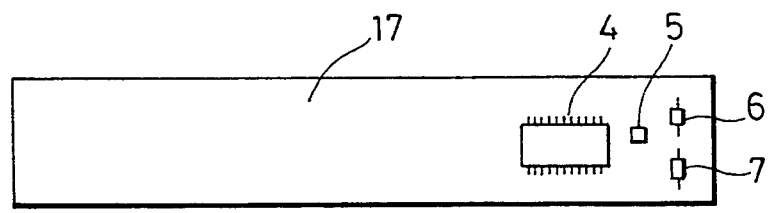

FIGS. 5(a) to 5(c) show assembled states of the high-voltage generator of FIG. 4, in which FIG. 5(a) is a plan view, FIG. 5(b) is a side view, and FIG. 5(c) is a back view. The piezoelectric transformer 1 is sealed in a package 16. The package 16, CMOS IC inverter 4, feedback resistor 5, and capacitors 6 and 7 are arranged on the opposite faces of a substrate 17.

Since this high-voltage generator needs no winding transformer that occupies a large space, the high-voltage generator is small, thin and light with best use of the piezoelectric transformer 1 that is small, thin and light.

Figure 6:
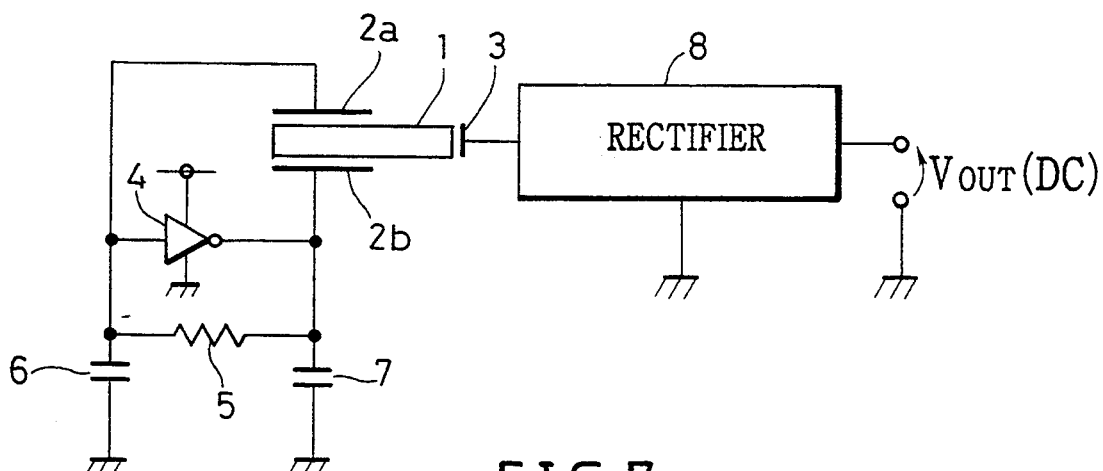
FIG. 6 is a circuit diagram showing a high-voltage generator according to a second embodiment of the present invention.

FIG. 6 shows a high-voltage generator according to the second embodiment of the present invention.

This generator generates a direct-current (DC) high voltage. An output terminal 3 of a piezoelectric transformer 1, which is the same as that of FIG. 4, is connected to a rectifier 8, which provides a DC high voltage Vout(DC).

Figure 7:
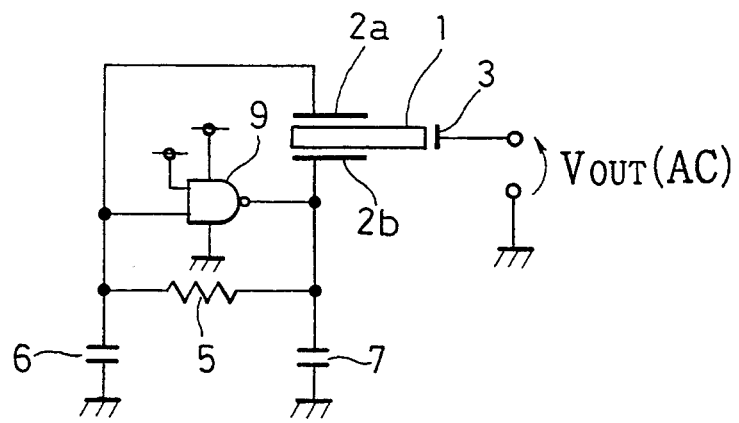
FIG. 7 is a circuit diagram showing a high-voltage generator according to a third embodiment of the present invention.

FIG. 7 shows a high-voltage generator according to the third embodiment of the present invention. This generator employs a NAND gate 9 instead of the CMOS IC inverter 4 of FIG. 4, to provide the same effect as the embodiment of FIG. 4.

Figure 8:
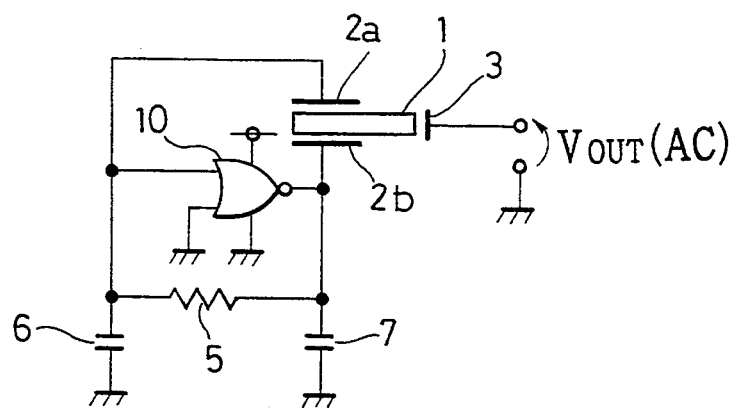
FIG. 8 is a circuit diagram showing a high-voltage generator according to a fourth embodiment of the present invention.

FIG. 8 shows a high-voltage generator according to the fourth embodiment of the present invention. This generator employs a NOR gate 10 instead of the CMOS IC inverter 4 of FIG. 4, to provide the same effect as the embodiment of FIG. 4.

FIGS. 9(a) and 9(b) show the frequency characteristics of the piezoelectric transformer 1.

The piezoelectric transformer 1 is a ceramic oscillator having several natural oscillation points 11 as shown in FIG. 9(a). Among these points 11, only a few can perform a sufficient step-up operation to provide a high voltage. These few effective points are 12 and 13 shown in FIG. 9(b). The point 12 corresponds to a so-called Lambda/2 mode, and the point 13 corresponds to a so-called Lambda mode. The Lambda/2 mode demonstrates a high step-up ratio at a frequency of f1, and the Lambda mode demonstrates a high step-up ratio at a frequency of f2.

Although the piezoelectric transformer has another natural oscillation point at a higher frequency of f3, this point demonstrates a low step-up ratio as indicated by 14 in FIG. 9(b). Namely, the frequency f3 does not provide a high voltage.

Figure 10:
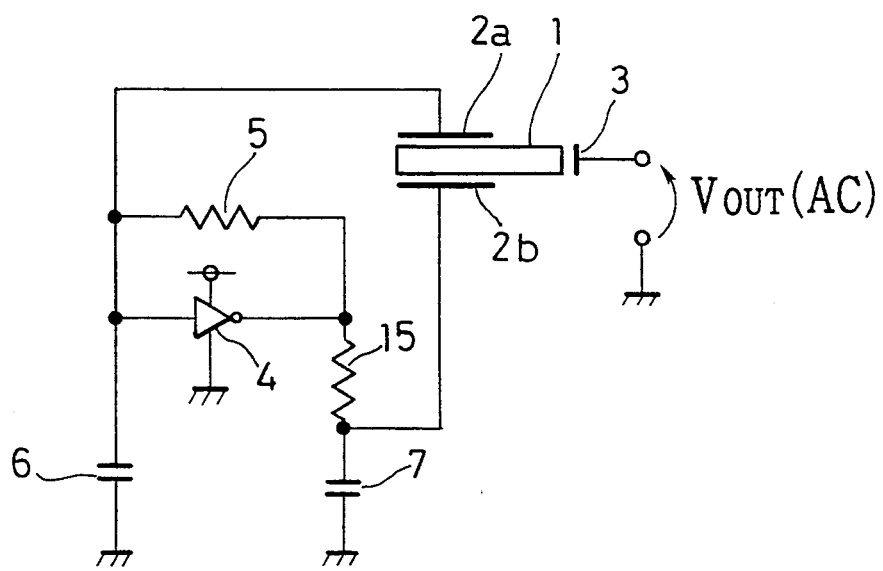
FIG. 10 is a circuit diagram showing a high-voltage generator according to a fifth embodiment of the present invention.

In order not to operate at such ineffective higher frequencies, FIG. 10 shows a high-voltage generator according to the fifth embodiment of the present invention. This embodiment inserts a damping resistor 15 between an output terminal of an inverter 4 and an input terminal 2b of a piezoelectric transformer 1.

As explained above, a high-voltage generator according to the present invention employs a piezoelectric transformer and a self-exciting oscillator for driving the piezoelectric transformer. The self-exciting oscillator employs a CMOS IC inverter to simplify the structure of the high-voltage generator. The present invention fully utilizes the advantage of the piezoelectric transformer that it is small, thin and light, to thereby make the high-voltage generator small, thin and light.

Various modifications will become possible for those skilled in the art after receiving the teachings of the present disclosure without departing from the scope thereof.

What is claimed is:

1. A high-voltage generator employing a piezoelectric transformer, comprising:
   a CMOS-IC inverter having input and output terminals connected to input terminals of the piezoelectric transformer, respectively;
   a feedback resistor connected to the input terminals of the piezoelectric transformer in parallel with said CMOS-IC inverter;
   first and second capacitors, said first capacitor being connected between the input terminal of said inverter and a ground, said second capacitor being connected between the output terminal of said inverter and the ground; and
   a power source connected to said CMOS-IC inverter, so that said CMOS-IC inverter, feedback resistor, and first and second capacitors form a self oscillation circuit.

2. The high voltage generator according to claim 1, wherein the piezoelectric transformer has an output connected to a rectifier.

3. The high-voltage generator according to claim 1, further comprising:
   a damping resistor connected between the output terminal of said inverter and a corresponding one of the input terminals of the piezoelectric transformer.

4. A high-voltage generator employing a piezoelectric transformer, comprising:
   a NAND gate having input and output terminals connected to input terminals of the piezoelectric transformer, respectively;
   a feedback resistor connected to the input terminals of the piezoelectric transformer in parallel with said NAND gate; and
   first and second capacitors, the first capacitor being connected between the input terminal of said NAND gate and a ground, the second capacitor being connected between the output terminal of said NAND gate and the ground.

5. A high-voltage generator employing a piezoelectric transformer, comprising:
   a NOR gate having input and output terminals connected to input terminals of the piezoelectric transformer, respectively;
   a feedback resistor connected to the input terminals of the piezoelectric transformer in parallel with said NOR gate; and
   first and second capacitors, the first capacitor being connected between the input terminal of said NOR gate and a ground, the second capacitor being connected between the output terminal of said NOR gate and the ground.

* * * * *